(12) United States Patent
Eckersley et al.

(10) Patent No.: US 11,598,892 B2
(45) Date of Patent: Mar. 7, 2023

(54) METHOD FOR VALIDATING GEOLOGICAL MODEL DATA OVER CORRESPONDING ORIGINAL SEISMIC DATA

(71) Applicant: Foster Findlay Associates Limited, Newcastle upon Tyne (GB)

(72) Inventors: Adam Eckersley, Newcastle upon Tyne (GB); James Lowell, Newcastle upon Tyne (GB); Jonathan Henderson, Newcastle upon Tyne (GB); Gaynor Suzanne Paton, Newcastle upon Tyne (GB)

(73) Assignee: Foster Findlay Associates Limited, Newcastle upon Tyne (GB)

( * ) Notice: Subject to any disclaimer, the term of this patent is extended or adjusted under 35 U.S.C. 154(b) by 587 days.

(21) Appl. No.: 16/619,838

(22) PCT Filed: Jun. 11, 2018

(86) PCT No.: PCT/GB2018/051589
§ 371 (c)(1),
(2) Date: Dec. 5, 2019

(87) PCT Pub. No.: WO2018/229469
PCT Pub. Date: Dec. 20, 2018

(65) Prior Publication Data
US 2020/0096660 A1  Mar. 26, 2020

(30) Foreign Application Priority Data
Jun. 12, 2017 (GB) .................................... 1709332

(51) Int. Cl.
*G01V 1/30* (2006.01)
*G06F 30/27* (2020.01)
(Continued)

(52) U.S. Cl.
CPC .............. *G01V 1/306* (2013.01); *G01V 1/282* (2013.01); *G01V 99/005* (2013.01); *G06F 30/27* (2020.01);
(Continued)

(58) Field of Classification Search
CPC ...... G01V 1/306; G01V 1/282; G01V 99/005; G06F 30/27
(Continued)

(56) References Cited

U.S. PATENT DOCUMENTS

| 4,679,174 A | * | 7/1987 | Gelfand ................. G01V 1/282 367/45 |
| 5,153,858 A | * | 10/1992 | Hildebrand ............ G01V 1/301 367/72 |

(Continued)

FOREIGN PATENT DOCUMENTS

| EP | 0745870 | 12/1996 |
| EP | 2867703 | 5/2015 |

(Continued)

OTHER PUBLICATIONS

Corbel et al. (Framework for multiple hypothesis testing improves the use of legacy data in structural geological modeling, GeoResJ 6 (2015) 202-212) (Year: 2015).*

(Continued)

*Primary Examiner* — Iftekhar A Khan
(74) *Attorney, Agent, or Firm* — Workman Nydegger

(57) ABSTRACT

Techniques for generating a geological model from 3D seismic data and rock property data are disclosed. Rock property data and 3D seismic data are received. Based on the rock property data and the 3D seismic data, an adaptive geological model is generated. The adaptive geological model includes a characteristic geological property. Synthetic seismic data is generated from a first region of interest (Continued)

of the adaptive geological model. The synthetic seismic data is adapted to facilitate a comparison between the first region of interest and a corresponding region of interest of the received 3D seismic data. The characteristic geological property is adjusted until the comparison indicates a result that is within a predetermined threshold region of the corresponding value from the rock properties. A validated geologic model is then generated.

16 Claims, 15 Drawing Sheets

(51) Int. Cl.
  *G01V 1/28* (2006.01)
  *G01V 99/00* (2009.01)
(52) U.S. Cl.
  CPC ............... *G01V 2210/614* (2013.01); *G01V 2210/6169* (2013.01); *G01V 2210/62* (2013.01); *G01V 2210/642* (2013.01); *G01V 2210/6652* (2013.01)
(58) Field of Classification Search
  USPC .................................................... 703/6
  See application file for complete search history.

(56) References Cited

U.S. PATENT DOCUMENTS

| | | | | |
|---|---|---|---|---|
| 8,566,069 B2* | 10/2013 | Pauget | ............... | G01V 1/30 702/16 |
| 8,577,660 B2* | 11/2013 | Wendt | ............... | G01V 11/00 703/7 |
| 8,908,926 B2* | 12/2014 | Henderson | ........... | G01V 1/32 382/109 |
| 9,223,041 B2* | 12/2015 | Wendt | ............... | G01V 1/306 |
| 9,366,773 B2* | 6/2016 | Walker | ............... | G01V 1/34 |
| 10,338,243 B2* | 7/2019 | Mcardle | ............. | G01V 1/38 |
| 10,585,201 B2* | 3/2020 | Mcardle | ............. | G01V 1/345 |
| 11,493,658 B2* | 11/2022 | Xia | ..................... | G01V 1/50 |
| 2002/0013661 A1* | 1/2002 | Van Riel | ............. | G01V 1/306 702/2 |
| 2004/0062145 A1* | 4/2004 | Dunn | ................. | G01V 1/288 367/72 |
| 2005/0171700 A1* | 8/2005 | Dean | ................. | G01V 1/301 702/16 |
| 2010/0040281 A1* | 2/2010 | Chen | ................. | G06N 3/086 340/853.2 |
| 2010/0149917 A1* | 6/2010 | Imhof | ............... | G01V 1/345 367/53 |
| 2010/0214870 A1* | 8/2010 | Pepper | ............. | G06T 7/187 367/72 |
| 2011/0002194 A1* | 1/2011 | Imhof | ............... | G01V 1/32 367/53 |
| 2011/0051553 A1* | 3/2011 | Scott | ................ | G01V 1/282 367/38 |
| 2011/0054857 A1* | 3/2011 | Moguchaya | ........ | G01V 99/00 703/2 |
| 2011/0115787 A1* | 5/2011 | Kadlec | ............. | G06T 7/12 702/14 |
| 2011/0246157 A1* | 10/2011 | Pauget | ............. | G01V 1/30 703/6 |
| 2011/0307178 A1* | 12/2011 | Hoekstra | ............ | G01V 1/28 702/5 |
| 2013/0030710 A1* | 1/2013 | Lomask | ............. | G01V 1/30 702/14 |
| 2013/0118736 A1* | 5/2013 | Usadi | ............... | E21B 41/00 166/268 |
| 2014/0067273 A1* | 3/2014 | Puryear | ............. | G01V 1/30 702/14 |
| 2014/0102694 A1* | 4/2014 | Hargreaves | ........ | G01V 1/282 166/250.01 |
| 2014/0140580 A1* | 5/2014 | Neave | ............... | G01V 1/345 382/109 |
| 2014/0278115 A1* | 9/2014 | Bas | ................... | G01V 99/005 702/14 |
| 2015/0219779 A1* | 8/2015 | Deng | ................ | G01V 1/30 702/16 |
| 2015/0234067 A1* | 8/2015 | Purves | ............... | G01V 1/30 702/14 |
| 2015/0293248 A1* | 10/2015 | Etgen | ............... | G01V 1/345 702/16 |
| 2015/0316683 A1* | 11/2015 | Purves | ............... | G01V 99/005 703/2 |
| 2016/0202370 A1* | 7/2016 | Wang | ................ | G01V 1/282 702/14 |
| 2018/0188403 A1* | 7/2018 | Halsey | ............... | E21B 41/00 |
| 2018/0292552 A1* | 10/2018 | Ramsay | ............. | G06F 30/00 |
| 2019/0025461 A1* | 1/2019 | Wiener | ............. | G01V 99/005 |
| 2019/0271788 A1* | 9/2019 | Guigné | ............. | G01V 1/306 |
| 2020/0088897 A1* | 3/2020 | Roy | ................... | G01V 1/306 |
| 2021/0255347 A1* | 8/2021 | Palmer | ............. | G01V 1/306 |

FOREIGN PATENT DOCUMENTS

| | | | | |
|---|---|---|---|---|
| EP | 2867705 | | 5/2015 | |
| EP | 3001866 | | 11/2016 | |
| EP | 3047311 | | 5/2018 | |
| WO | WO2013/012470 | | 1/2013 | |
| WO | WO-2013106720 A1 * | | 7/2013 | ............ E21B 43/00 |
| WO | WO2016/124878 | | 8/2016 | |
| WO | WO-2018148492 A1 * | | 8/2018 | ............ G01V 1/282 |
| WO | WO-2018229469 A1 * | | 12/2018 | ............ G01V 1/28 |

OTHER PUBLICATIONS

Valery Taranchuk (The integrated computer complex of an estimation and adapting of digital geological models, Studia i Materialy 14 (2017), s. 73-86) (Year: 2017).*

* cited by examiner

METHOD FOR VALIDATING GEOLOGICAL MODEL DATA OVER CORRESPONDING ORIGINAL SEISMIC DATA

CROSS-REFERENCE TO RELATED APPLICATIONS

The present application is a 35 U.S.C. § 371 U.S. National Stage of International Application No. PCT/GB2018/051589, filed on Jun. 11, 2018, which claims priority to Great Britain Patent Application No. 1709332.9, filed Jun. 12, 2017, the entire content of each of which is incorporated herein by reference.

The present invention relates generally to the field of oil and gas exploration, and in particular to the field of computer aided exploration for hydrocarbons using geophysical data, such as for example seismic data, of the earth. Even more particular, the present invention relates to geological modelling from 3D seismic data and optimising the conceptual model to the original corresponding 3D seismic data so as to minimise the uncertainty between the "real" properties and the interpreted properties derived from the geological model.

INTRODUCTION

In the oil and gas industry, geological data surveys such as, for example, seismic prospecting and other similar techniques are commonly used to aid in the search for and evaluation of subterranean hydrocarbon deposits. Furthermore, production geologists are increasingly using computer-based geological models or geomodel (e.g. using 3D geocellular modelling packages) to represent a reservoir's geology.

One of the challenges of the interpreter(s) is to try and replicate known or conceptual geological features that are presumed to be present in the subsurface. The geomodel may then help to more accurately predict the implications of the geological features in potentially being proven hydrocarbon reserves of commercial value. For example, seismic facies interpretation can play a significant role in the initial basin exploration, prospect evaluation, reservoir characterisation, and ultimately, field development.

A typical geological model may be used to control the distribution of relevant petro-physical well data to provide a basis for accurate volumetric assessment. However, most of the known conventional approaches to geological and property modelling rely on well data to drive the results, as (until very recently) the ability to see and derive information from seismic data was very limited. In particular, high-resolution geological models may be built upon 3D mathematical meshes that provide the numerical architecture for building the structural stratigraphic framework. The model(s) are then generally constructed and parameterized through software products that allow professional geoscientists to approximate the static state of the reservoir by interpolating or simulating, for example, geologic facies and their petro-physical properties within a 3D volume. This process is "model driven" from a scenario comprising the conceptual geological model. The interpolation and simulation algorithms used to fill, for example, the inter-well space, are performed using workflows based on these conceptual models and attempt to bind (or link) the results to logical rules derived from underlying geologic principles.

While the workflows can vary based on individual interpretation of the data, the results are generally obligated to respect the observed data. Within a given scenario, it is the interpolation algorithm that is responsible for providing the best estimate at every grid location and the simulation algorithm that is responsible for capturing the inherent variability, providing the basis for any uncertainty analysis.

For example, in the known art, the current geological modelling workflow may be as follows:

Build a structural framework (horizons and faults)
Use the horizons and faults to build a geo-cellular grid
Interpret log data to determine facies types within different geological layers and zones
Perform data analysis to identify trends in data
Upscale this information to populate the geo-cellular grid
Apply modelling algorithms to extrapolate property values away from wells—various options
Tie to any additional data source such as seismic attributes or trends This process can take weeks or months to complete, and usually involves a simplification of interpreted horizons and/or faults, and may require a reduction in lateral resolution to create the geocellular grid.

Some of the geological variations that may be seen in well log data are too complex to attempt to model. Often, there is additional degradation of the data due to the averaging methods used to assign values to grid cells.

Furthermore, away from the well, petro-physical well data may be distributed to all cells within the geological model using geostatistics. In this process, extrapolation of property values away from a well is often tied to seismic attributes such as, for example, the acoustic impedance.

As can be seen, current methods and modelling techniques include significant number of assumptions and approximations that are made during the geological modelling workflow and none of these methods or techniques are capable of providing any kind of quality assurance of the modelled data and interpreted properties. I.e. the interpreter has now way of knowing how closely the generated geological model matches the original data. Furthermore, none of the available techniques/methods is able to (quickly and easily) assess different assumptions and approximations, so as to ensure the best fit of the modelled data.

SUMMARY OF THE INVENTION

Preferred embodiment(s) of the invention seek to overcome one or more of the above disadvantages of the prior art.

According to a first aspect of the invention there is provided a computer implemented method for generating a validated geological model from three-dimensional (3D) seismic data and legacy data, the method comprising the steps of:
(a) receiving said legacy data from a first data source;
(b) receiving said 3D seismic data from a second data source;
(c) based on receiving said legacy data and said 3D seismic data, generating an adaptive geological model from said 3D seismic data, said adaptive geological model comprising at least one characteristic geological property;
(d) generating at least one synthetic seismic data from at least a first region of interest of said adaptive geological model, the synthetic seismic data being adapted to determine a qualitative similarity value between at least said first region of interest of said adaptive geological model and a corresponding region of interest of said received 3D seismic data;
(e) comparing said qualitative similarity value to a corresponding value within said legacy data;

(f) adjusting said at least one characteristic geological property until said qualitative similarity value is within a predetermined threshold region of said corresponding value from said legacy data, and (g) automatically generating said validated geologic model including said at least one characteristic geological property that has been modified to be within said predetermined threshold region of said corresponding value from said legacy data.

Advantageously, said adaptive geological model may be based on a grid derived from said 3D seismic data. Preferably, said legacy data may include at least one characteristic geological property from any one of a well-log data and at least one predefined library.

Advantageously, said at least one characteristic geological property may be assigned from and modified in accordance with at least one probable data pattern determined utilising machine-learning.

Preferably, said at least one characteristic geological property may be assigned utilising any one of 'Kriging', 'Co-Kriging', stochastic modelling, a data from a predefined library, or 'machine-learning'. Even more preferably, said probable date pattern may be determined using at least one predetermined training data.

Even more preferably, said at least one characteristic geological property may be at least one rock characteristic.

Advantageously, said adaptive geological model may comprise a plurality of geological objects.

Advantageously, all of said plurality of geological objects may be adaptively linked to each other.

Advantageously, said plurality of geological objects may include any one of or any combination of a geobody, a horizon, a fault, and any other suitable planar geological feature derivable from said 3D seismic data.

Advantageously, in step (e) said at least one synthetic data is compared to said 3D seismic data utilising any one of visual comparison, a trace-by-trace correlation, a difference between predetermined correlating volumes, spectral comparison.

According to a second aspect of the invention there is provided a computer system for generating a validated geological model from 3D seismic data and legacy data by a method according to any one of the preceding claims.

According to a third aspect of the invention there is provided a computer readable storage medium having embodied thereon a computer program, when executed by a computer that is configured to perform the method of the first aspect of the invention.

Alternatively, there is provided a method for validating a geological model to a corresponding 3D seismic data, comprising the steps of:

(a) generating an adaptive geological model from said original 3D seismic data comprising at least one first characteristic geological property;

(b) generating at least one synthetic seismic data from at least a first region of interest of said adaptive geological model that is adapted to determine a qualitative similarity value to a corresponding region of interest of said original 3D seismic data;

(c) comparing said qualitative similarity value to a predetermined reference value;

(d) modify said at least one first characteristic geological property until said qualitative similarity value is within a predetermined threshold region from said predetermined reference value.

Advantageously, in the alternative method, in step (d) said at least one first characteristic geological property is modified based on at least one probable data pattern determined using machine learning algorithms. Preferably, said at least one probable data pattern is determined utilising a predetermined training set of said at least one first characteristic geological property. Even more preferably, said at least one first characteristic geological property is at least one rock characteristic.

BRIEF DESCRIPTION OF THE DRAWINGS

Preferred embodiments of the present invention will now be described, by way of example only and not in any limitative sense, with reference to the accompanying drawings, in which.

DETAILED DESCRIPTION OF THE PREFERRED EMBODIMENT(S)

The exemplary embodiments of this invention will be described in relation to geological modelling described in any one of EP2867703A, EP2867705A, EP3047311A, EP3001866B and WO2016/124878. However, it should be appreciated that, in general, the method and system of the present invention will work equally well with any other geological model created from 2D or 3D seismic data.

For purposes of explanation, it should be appreciated that the terms 'determine', 'calculate' and 'compute', and variations thereof, as used herein are used interchangeably and include any type of methodology, process, mathematical operation or technique. The terms 'generating' and 'adapting' are also used interchangeably describing any type of computer modelling technique for visual representation of a subterranean environment from geological survey data, such as 3D seismic data. In addition, the terms 'vertical' and 'horizontal' refer to the angular orientation with respect to the surface of the earth, i.e. a seismic data volume is orientated such that 'vertical' means substantially perpendicular to the general orientation of the ground surface of the earth (assuming the surface is substantially flat), and 'horizontal' means substantially parallel to the general orientation of the ground surface of the earth. In other words, a seismic data volume is therefore in alignment with respect to the surface of the earth so that the top of the seismic volume is towards the surface of the earth and the bottom of the seismic volume is towards the centre of the earth. In addition, the term 'time domain' may also define the vertical direction of the seismic traces with regards to the surface of the earth, whereas the term 'lateral' may refer to a horizontal displacement with regards to the to surface of the earth. Furthermore, the term 'atom' is generally known by the person skilled in the art and refers to an adapted wavelet from a dictionary of wavelets to generate an analytical model function.

Figure 1:
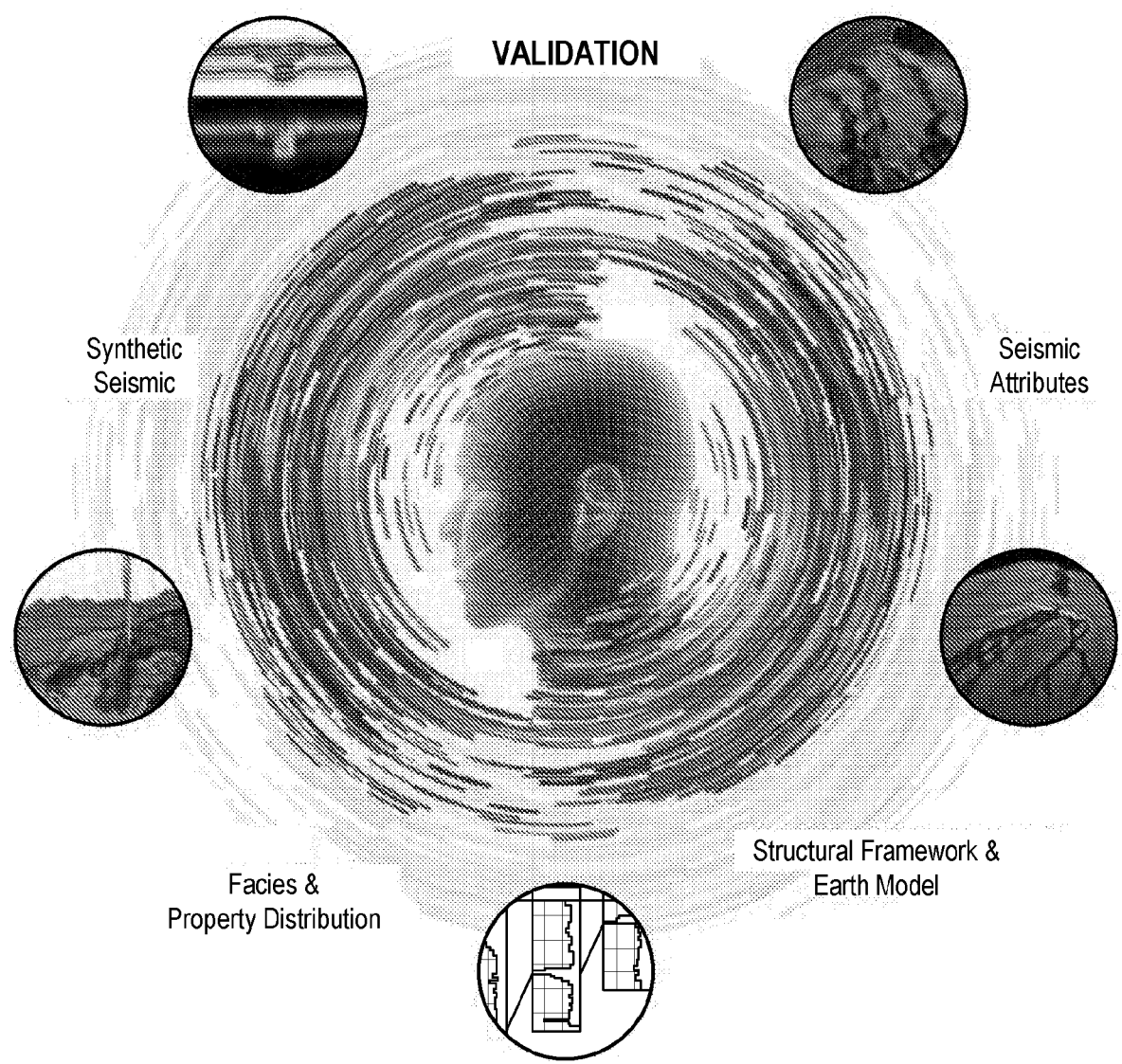
FIG. 1 shows an illustration of the workflow of the present invention "closing the loop" between the generated geomodel and the original seismic data through validation.

As illustrated in FIG. 1, the computer system with improved functionality from the present invention "closes the loop" between the 3D geological model and the original seismic data. The new concept enables both the seismic interpretation and the geological concepts to be validated against the original data and allows different geological hypotheses suggested by the data to be examined.

In particular, the purpose of the invention is to make it much easier to Quality Control (QC) and therefore validate any 3D geological model and it's underpinning geological concepts.

A preferred method of the initial geological model building is now discussed.

Model Creation

Figure 2A:
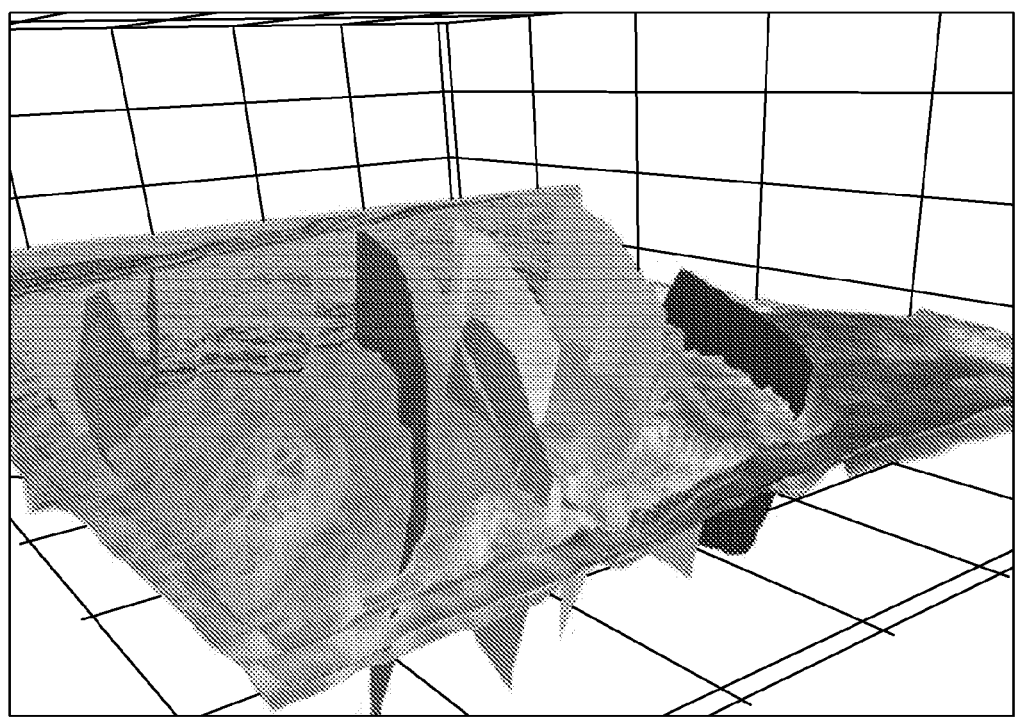
FIG. 2 shows (a) an example illustration of adaptive horizons and faults, and (b) an example illustration of a watertight model created using and adaptive framework.
Figure 2B:
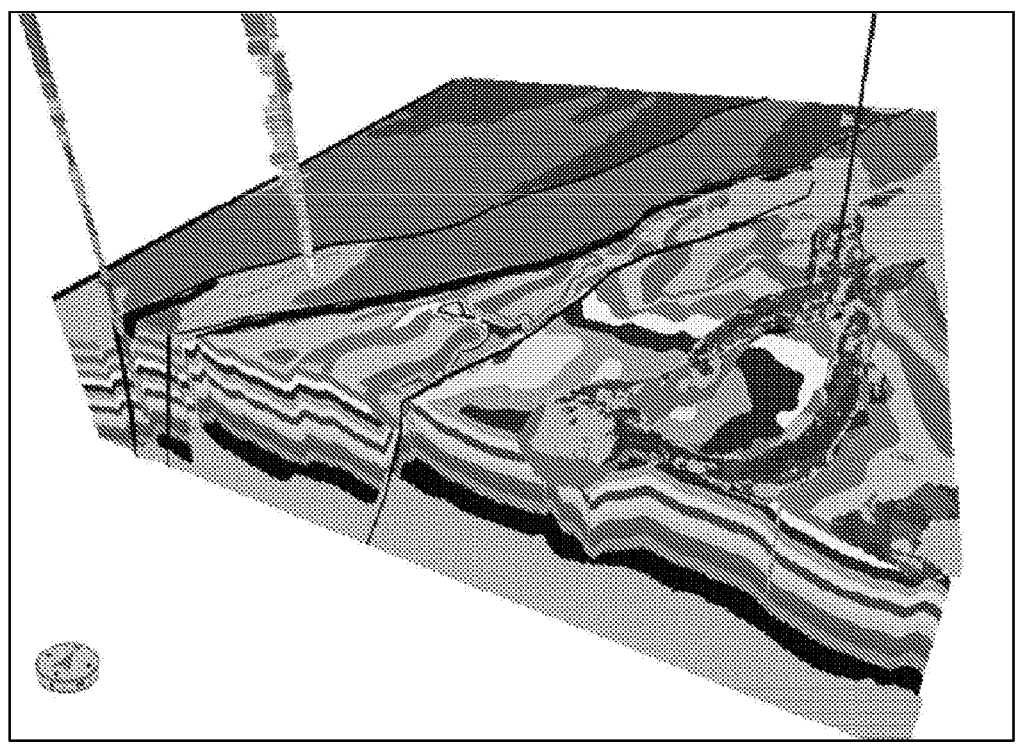

As shown in FIG. 2, a "watertight" geological model may be created using an adaptive framework as described in any or all of EP2867703A, EP2867705A, EP3047311A, EP3001866B and WO2016/124878. Within the adaptive framework, the interpreted adaptive horizons, faults and geobodies are linked to one another, and are configured to update "on the fly" when any one of these adaptive surfaces (i.e. horizons, faults and geobodies) are modified (e.g. by the interpreter), or the interpretation is refined.

In many real applications, the geocellular grid (corner point grid), used to model petrophysical and dynamic properties in the reservoir, does not coincide with the seismic grid. In particular, geocellular grid cells are usually larger than the bin size of the seismic survey. In the present invention, the automatic refinement/adaption of the surfaces occurring on the seismic grid, removes the need to generate a geocellular grid. As is known from the currently available prior art, the creation of a geocellular grid can take a significant amount of time, as the surfaces are adjusted/modified to fit, for example, to a coarser grid. In the present invention, the automatic refinement is based on the seismic grid making the process of interpretation faster and more efficient.

Figure 3A:
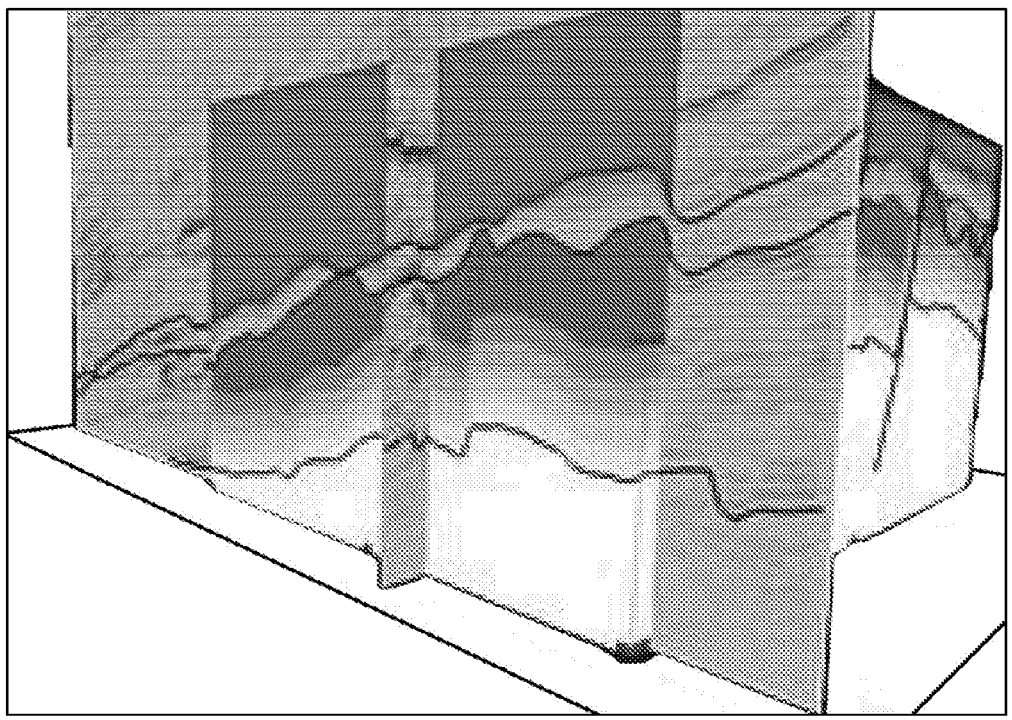
FIG. 3 shows (a) an illustration of additional layers that are automatically created between horizons, and (b) an illustration of the additional layering between horizon pairs being displayed as a volume.
Figure 3B:
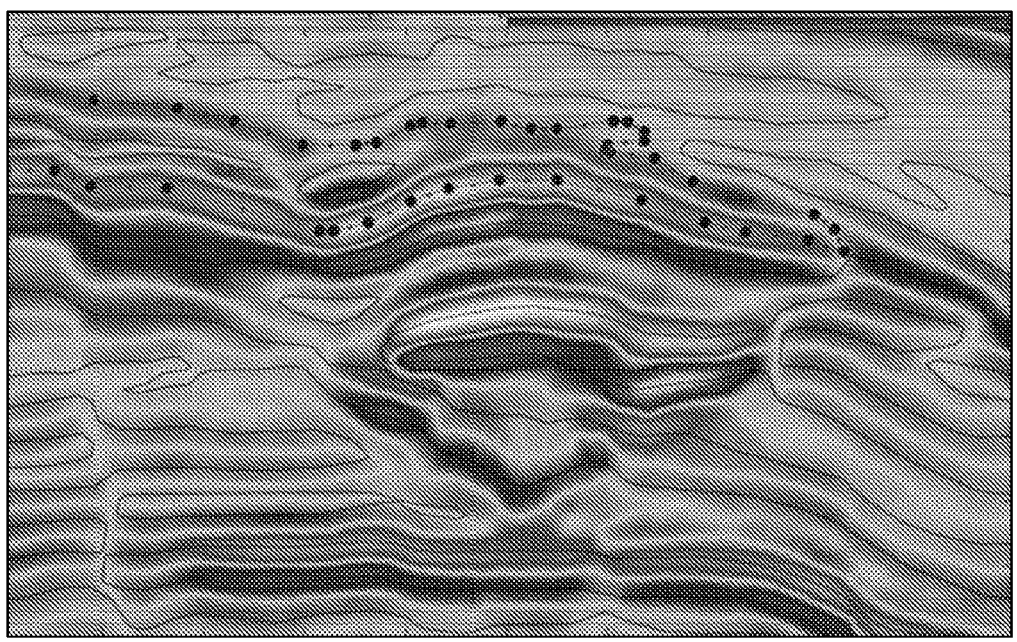
Figure 4:
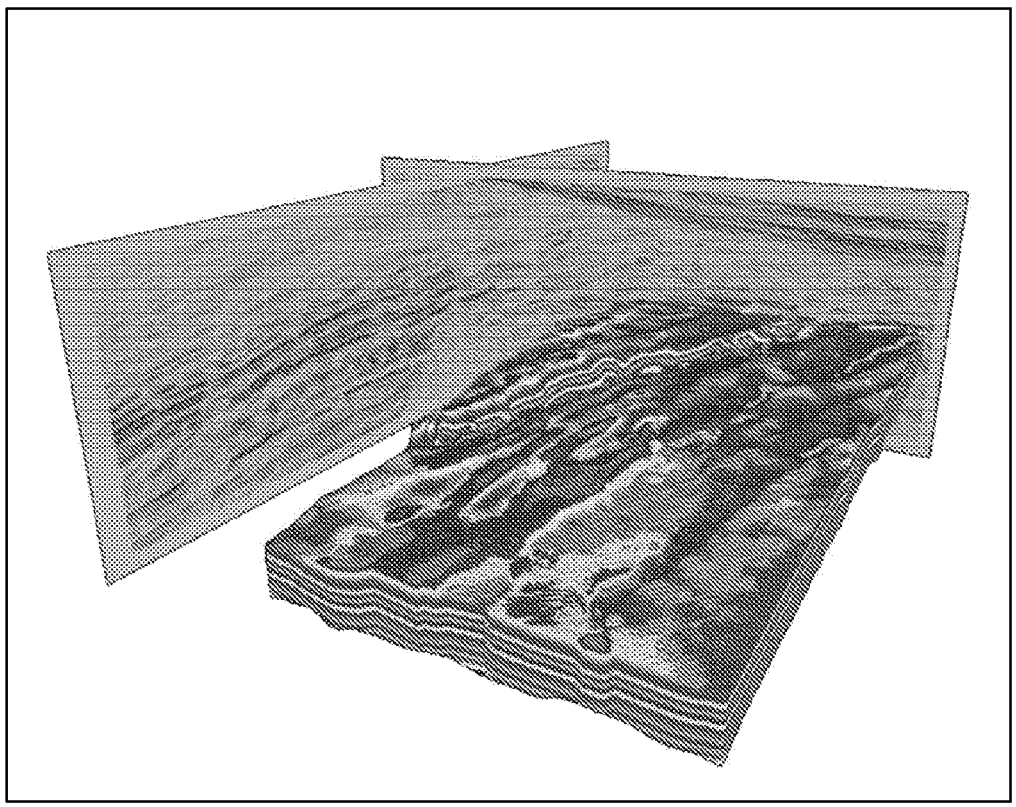
FIG. 4 shows an illustration of the distribution of rock properties within each geological layer.

As illustrated in FIGS. 3 (a) and (b), within the "watertight" model, additional layers between interpreted horizons and faults can be defined manually or automatically. I.e., the manually and automatically detected layers can be edited so that boundaries can be shifted or layers can be combined or split. This provides a very efficient method to divide the data into compartments representing different geological units. As is shown in FIG. 4, the geometries defined by the interpreted and automatically generated layers may form zones with assigned rock properties. Layers can be based on user-defined horizons, data-driven sub-horizons or iso-proportional slicing. The advantage of user-defined layers or horizons is that each layer is manually QC'ed (quality controlled), though at the expense of increased time. Iso-proportional slicing may be advantageous in really noisy data or complex data (where signals are patchy), using other horizons to guide the intermediate layers through the noisy data.

Figure 5:
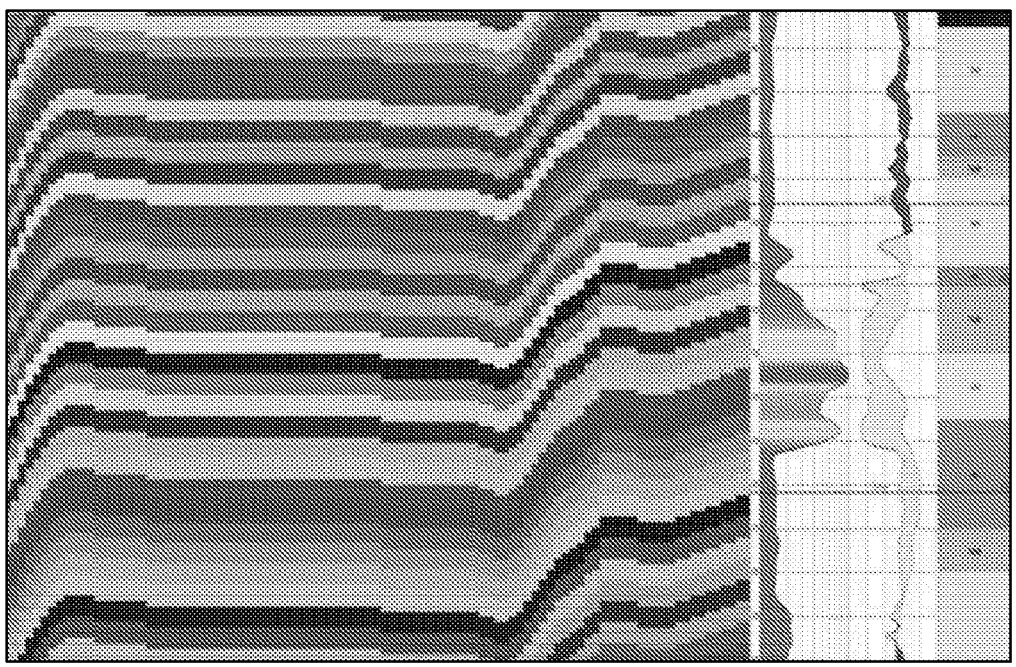
FIG. 5 shows an illustration of sub-seismic sample layers.

Also, as the vertical resolution of well log data is finer than seismic data, within each zone, intermediate subsample layers are defined to be more closely spaced than the seismic sampling. Rock properties are then assigned to each of these units or groups of units. FIG. 5 illustrates a preferred method for subsampling the layers using iso-proportional slicing. The rock properties can then be assigned to each layer directly from any one of a well-data, a pre-defined library of common rock properties from different regions of the world, or by using machine learning.

Once a geological model has been created (or a previous geological model has been provided), the hypotheses represented by that model are validated. During the validation, any one of the whole volume, a sub-volume or a slice of the geological model may be examined.

Validation

The validation step provides a fast, practical workflow, that enables cross checking at every stage of the interpretation and 3D modelling workflow, making it easier to QC and validate both a 3D static model and the geological concepts that underpin that model.

Here, a synthetic model is created from the geological model using forward modelling techniques, so as to enable a comparison back to the original data, and also allow different ideas and concepts to be tested.

Various forwarding modelling techniques may be used to generate the synthetic model(s). A preferred forward modelling method of the present invention is as follows:

Forward Modelling

As is known, complex interference patterns occurring in seismic data and RGB frequency colour blends can be related to thickness and impedance variations. Although variation in bed thickness is a dominant factor controlling seismic amplitude and RGB blended frequency decomposition colour responses, subtle lithological changes (presented as differences in acoustic impedance contrast) can be differentiated as a second order effect.

Figure 6:
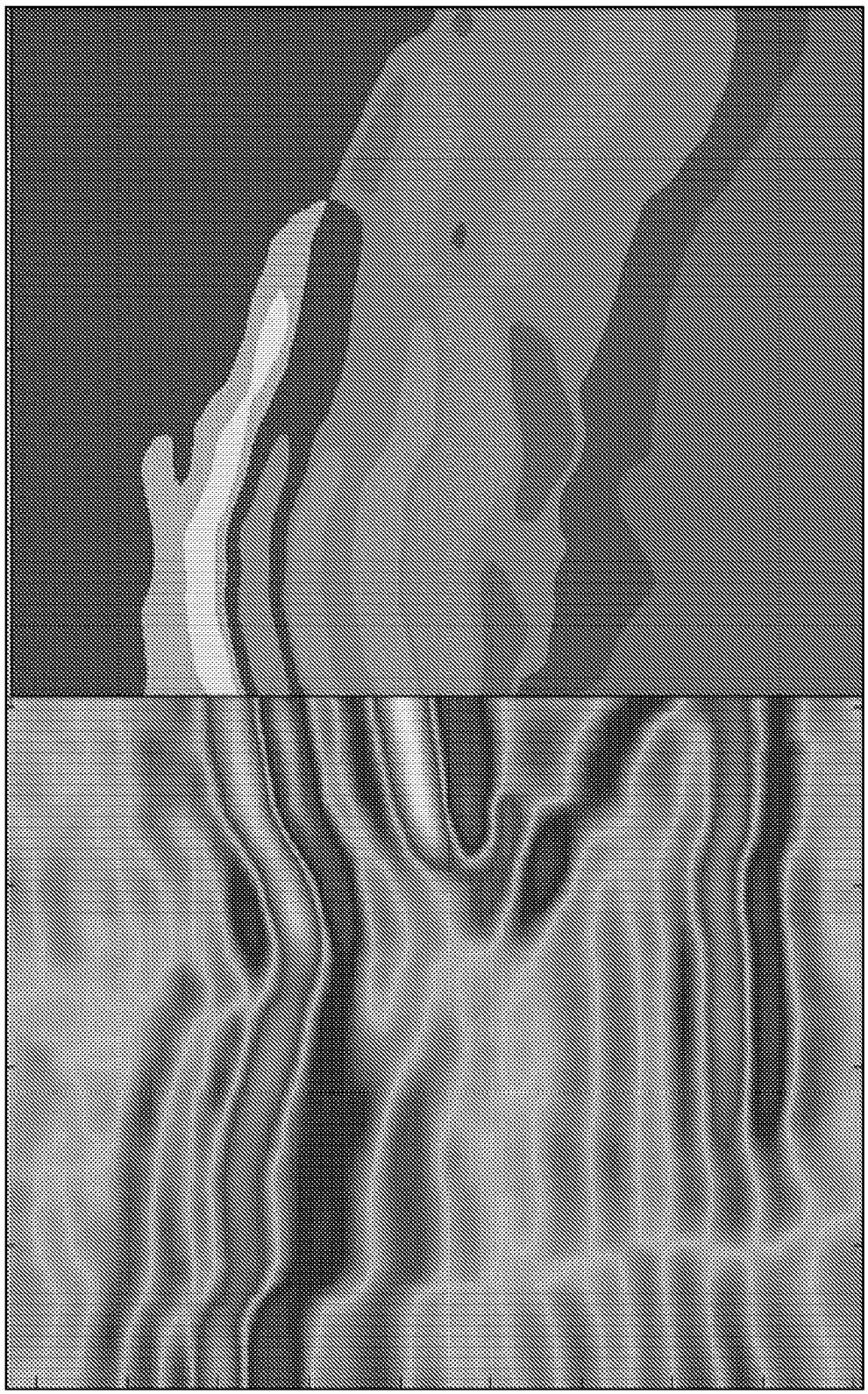
FIG. 6 shows an illustration of a geological model at seismic scale representing seismic data.
Figure 7A:
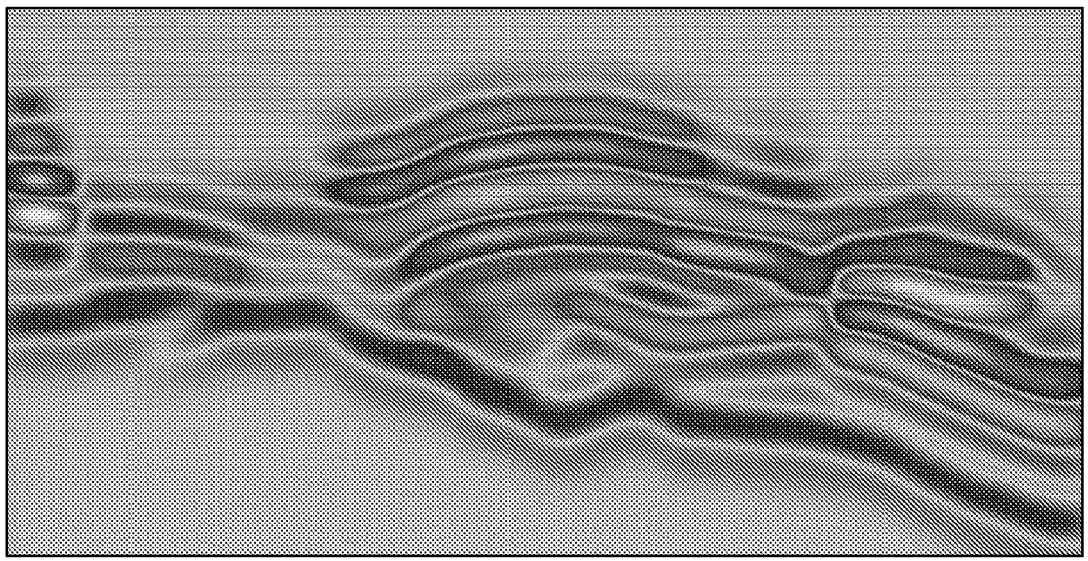
FIG. 7 shows (a) an illustration of variable density modelling the seismic, and (b) an illustration of an RGB frequency blend proceeded directly on the variable density.
Figure 7B:
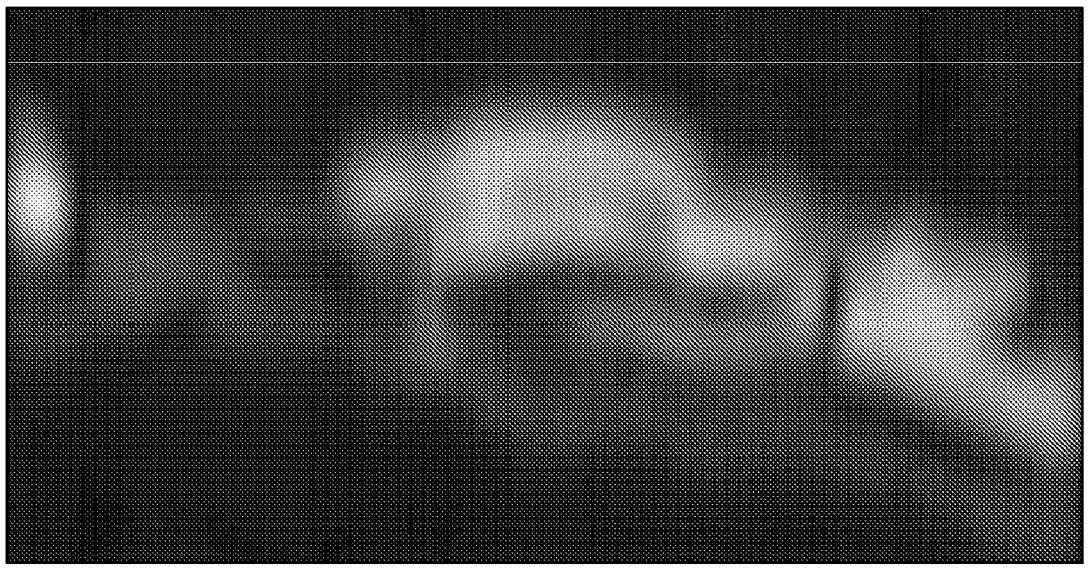

Referring now to FIGS. 6 and 7, forward modelling is used to model the complex interference patterns occurring in seismic. Forward modelling generates synthetic variable density volumes that are derived from earth models or other geological models. Although, a variety of forward modelling algorithms are suitable for generating synthetic variable density volumes, the preferred algorithms used with the present invention are the Aki-Richards approximation to the Zoeppritz equations.

Aki-Richards Approximation for Forward Modelling

Modelling seismic wave energy as it partitions at the interface of two different rock layers is a fundamental part of forward modelling. The use of the Zoeppritz equations to model rock boundaries, as well as, a number of linearized approximations to the Zoeppritz equations, have been accepted for a long time.

An overview of the Zoeppritz equations is now given, together with a description of the Aki-Richards approximation.

The Zoeppritz equations calculate the amplitudes of transmitted and reflected components of the P- (longitudinal) and S- (transverse) waves for a seismic wave incident on a boundary between two different rock layers.

The full Zoeppritz system comprises four equations in four unknowns. The equations can be solved, but they do not provide an intuitive understanding of the relationship between the coefficients and the rock properties (e.g. density ($\rho$), P-wave velocity (Vp), S-wave velocity (Vs)) either side of the boundary. Of the four results calculated by these equations, the amplitude of the reflected P-wave is the most important characteristic for the forward modelling implementation within the method of the present invention.

In practice, there are numerous approximations for the Zoeppritz equations that are simpler and more intuitive to understand in terms of the rock properties. "'*Elastic-wave AVO methods*', by Bill Goodway—PanCanadian Energy Corporation, [2002]" provides the Aki-Richards (1980) approximation. Again, this is the preferred approach in the method of the present invention. It is a three-term equation in terms of the ratios of density, P-wave velocity and s-wave velocity between the two surfaces, whose boundary the equation is applied to.

Figure 8:
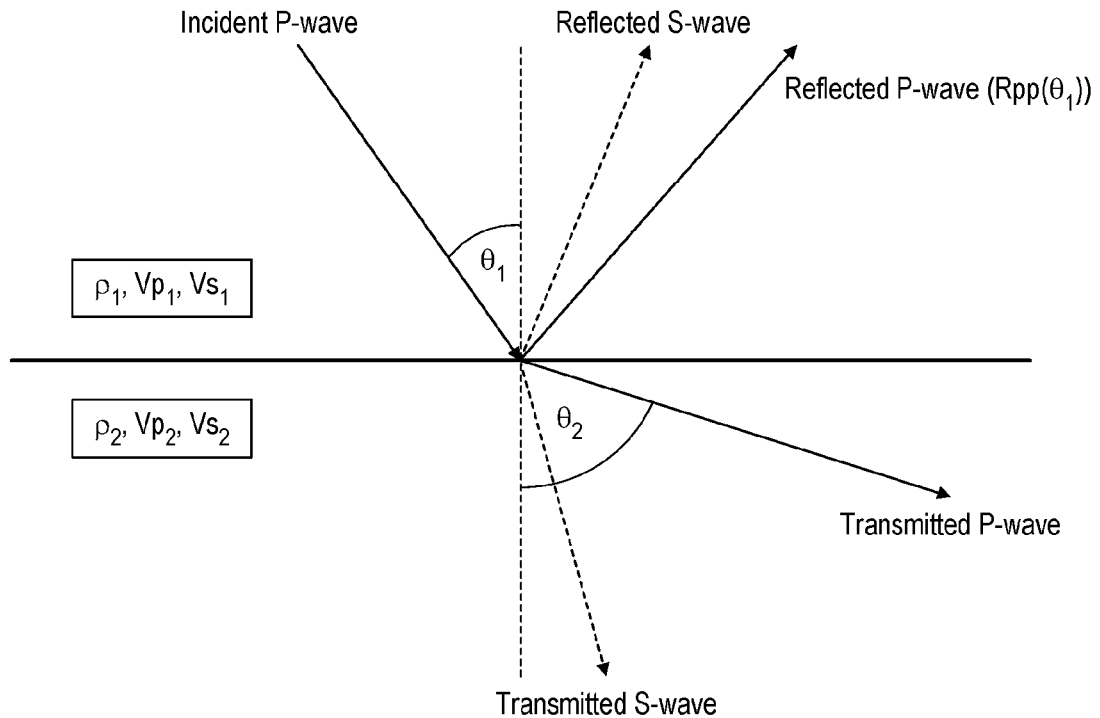
FIG. 8 shows a simplified illustration of a seismic wave hitting a layer boundary at an angle $\theta_1$, resulting in reflected and transmitted P- and S-waves.

FIG. 8 shows a simplified illustration of a wave hitting a boundary at an angle $\theta_1$, resulting in reflected and transmitted P- and S-waves. The reflection coefficient calculated using the Aki-Richards approximation is that of the reflected P-wave ($Rpp(\theta_1)$), given as:

$$Rpp(\theta_1) = \frac{1}{2}\left(\frac{\Delta V_p}{V_p} + \frac{\Delta \rho}{\rho}\right) - 2\frac{V_s^2}{V_p^2}\sin^2\theta_1\left(2\frac{\Delta V_s}{V_s} + \frac{\Delta \rho}{\rho}\right) + \frac{1}{2}\tan^2\theta_1\frac{\Delta V_p}{V_p}; \quad [\text{Eq. 1}]$$

where:

$$\Delta x = x_2 - x_1$$

$$x = \tfrac{1}{2}(x_1 + x_2)$$

for x representing each of $\rho$, Vp, Vs.

The other three results that can be obtained from both, the Zoeppritz and Aki-Richards equations, are the amplitudes of the transmitted P-wave and of the reflected and transmitted S-waves.

The angle of the transmitted P-wave is determined by Snell's law as:

$$\frac{\sin\theta_1}{Vp_1} = \frac{\sin\theta_2}{Vp_2}; \quad [\text{Eq. 2}]$$

Snell's law is used in ray tracing algorithms, which take into account the impact of different layers in a multi-layered model. In such algorithms, the transmitted P-wave from the first boundary encountered would determine the angle at which the wave with an initial angle of $\theta_1$ hits the second boundary.

However, the method of the present invention does not account for this, but instead considers each boundary independently of the rock layers that lie above it. Whilst this provides a less accurate model, it does have the property that a boundary between the same two rock types will always yield the same reflection coefficient, irrespective of where it sits in the model, so that changing the upper layers of the model will not affect the synthetic seismic result in the lower part of the model.

Where multiple angles of incidence are used, $Rpp(\theta)$ is calculated for $\theta$ at 1° [deg] intervals from the minimum to the maximum angle in the range. The resulting values are averaged with a mean function to yield a single reflection coefficient, $Rpp(\theta_{(min,max)})$, for an angle range from $\theta_{min}$ to $\theta_{max}$.

A seismic trace $s(\theta)$ for an incidence angle $\theta$, is defined from the reflectivity $Rpp(\theta)$ and the wavelet $\omega$ by:

$$s(\theta) = Rpp(\theta) * w; \quad [\text{Eq. 3}]$$

The earlier Aki-Richards approximation of Zoeppritz equations is used to compute the reflectivity (Rpp) from the rock properties.

Figure 9:
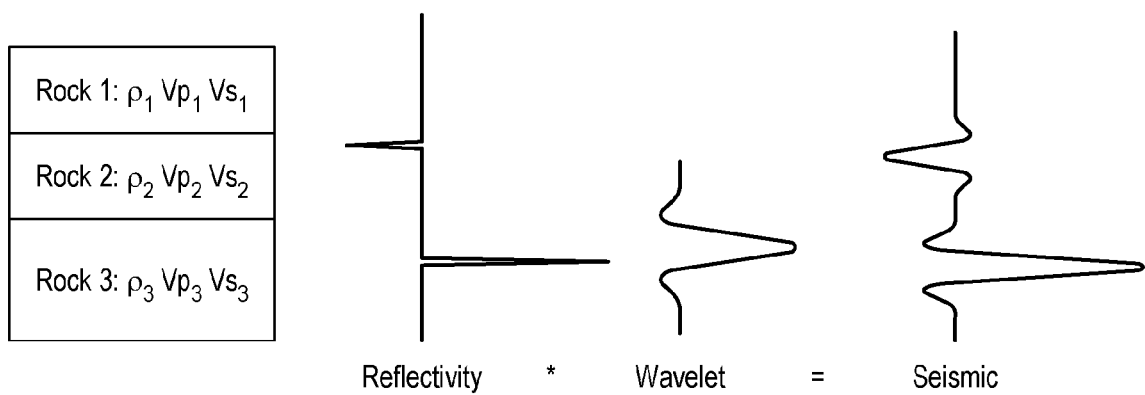
FIG. 9 shows an illustration of rock boundaries, as well as, wavelet extraction.

Generic wavelets such as a Ricker or Gabor can be used to then generate a synthetic trace, however, to more accurately model the seismic, extracted wavelets may be used. FIG. 9 shows an illustration of three rock layers and its boundaries, as well as, wavelet extraction.

Wavelet Extraction

Wavelets are required to model the seismic wave energy as it partitions at the interface of two different rocks. The type of wavelet (such as Ricker, Gabor or any other suitable one) and its dominant frequency greatly influence the seismic reflectivity data produced from forward modelling.

To obtain more accurate models, wavelets extracted directly from the seismic is the preferred method. For example, wavelet extraction uses the data from a predetermined number of in-lines and cross-lines within a region of interest (ROI). A variety of techniques are available for wavelet extraction, including, for example, autocorrelation. The autocorrelation of the signal may use a rescaled version of the autocorrelation of the wavelet. This technique uses the Wiener-Khinchin theorem and extracts a zero phase wavelet. The spectrum of the wavelet can be computed from the spectrum of the autocorrelation of the signal:

$$F(w) = \sqrt{|F(C_{ww})|} = B\sqrt{|F(C_{ss})|}; \quad [\text{Eq. 4}]$$

for some constant, B.

And the wavelet is computed by inverse Fourier transform:

$$w = B \cdot F^{-1}(\sqrt{|F(C_{ss})|}); \quad [\text{Eq. 5}]$$

Figure 10:
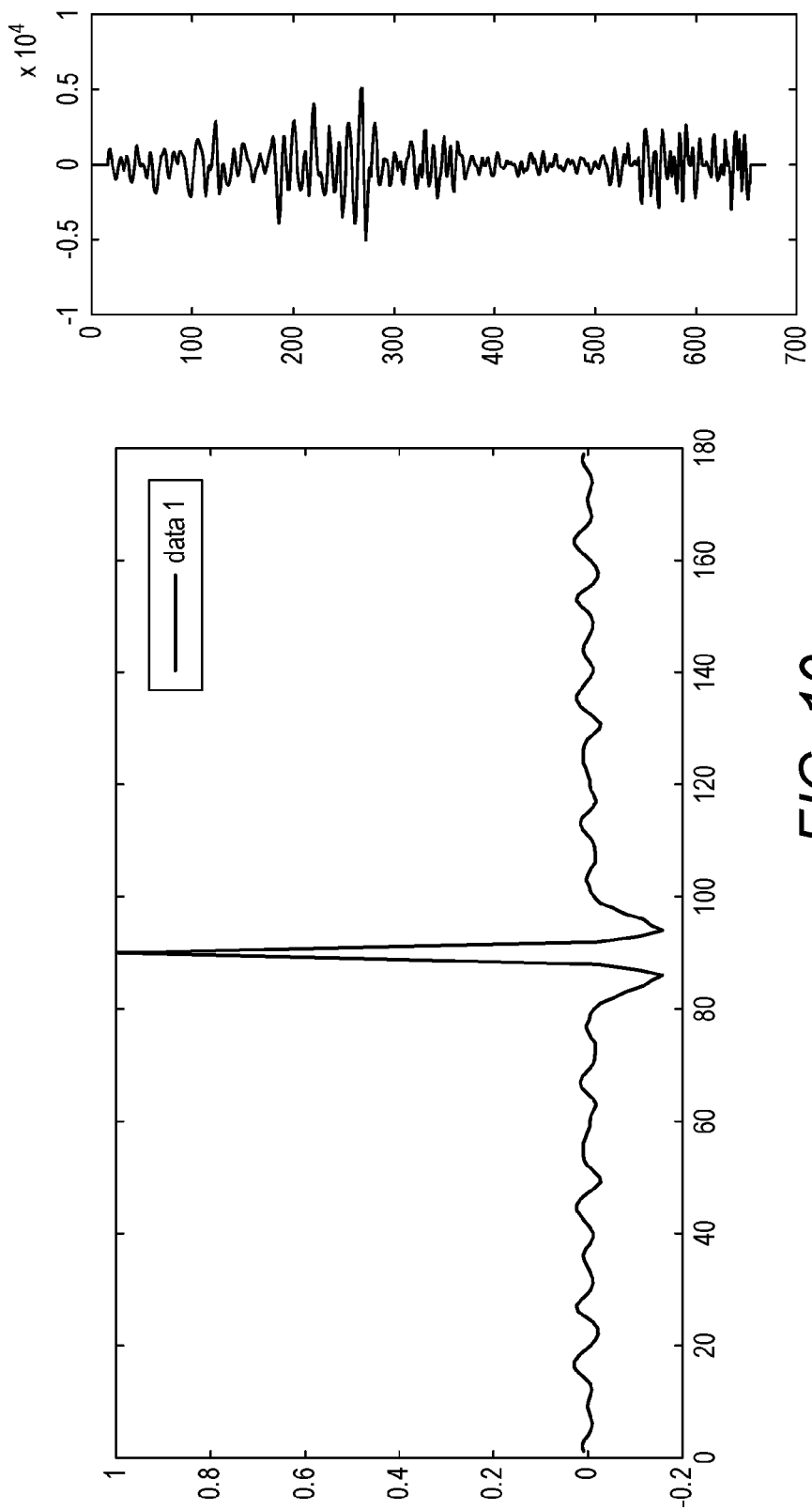
FIG. 10 shows an illustration of an example trace and corresponding extracted wavelet.

The final wavelet can be normalised by dividing it by its maximum value. FIG. 10 shows an illustration of an example trace and its extracted wavelet.

Parameters

Control over the synthetic generation of properties, such as frequency and phase of the wavelet, together with the range of angles, contributing to model and layer thicknesses and allow for the validity of the model to be examined.

Multiple realisations of the synthetic data can be produced to examine the effect of both changing the imaging parameters, but more importantly, to compare the effect of changing the layer properties.

In the present invention, an example driven approach is applied to easily compare the effect of changing parameters.

Similarly, frequency decomposition based RGB blends may be generated from the synthetic data, therefore, allowing the impact of changing the frequency decomposition parameters on the result to be examined. I.e. how the frequency response differs, if the rock layer properties are changed, or how the frequency response may change, if the parameters used to generate the synthetic data are changed.

Comparisons can then be made between (i) what is observed in the synthetic model and (ii) the results generated using the same frequency decomposition parameters on the original seismic data.

This level of interaction provides a unique and very easy to apply methodology for determining, whether or not, the geological model and the hypotheses used in defining it really are supported by the original seismic data.

Rock Property Propagation

Assigning rock properties within the model layers can be achieved using any one of the following techniques:

a) Kriging:

Kriging is an interpolation method that allows for creation of a model based on sparse data from, for example, multiple wells within a region. The aim is to "fill out" (i.e. populate) a 3D model, using the known well data, each weighted using spatial covariance to account for the distance of the target from each known data point. Kriging provides the best interpolation of the available points, as measured by minimising its associated error variance.

The general formula for Kriging, so as to estimate a value at an unknown point $\hat{Z}(s_0)$, can be given as:

$$\hat{Z}(s_0) = \Sigma_{i=1}^{N} \lambda_i Z(s_i); \quad [\text{Eq. 6}]$$

where $Z(S_i)$ are the measured values at N known locations and $\lambda_i$, are unknown weights, to be determined, summing to '1'. Kriging varies from other simpler methods in that these weights are based on the spatial arrangement of the known data points, rather than just their distance from the target. This allows for isolated known data points to be weighted more than clusters of points, which may contribute more similar and sometimes redundant information.

Variations of the Kriging technique allow for additional information to be used to determine the weights $\lambda_i$.

b) Co-Kriging:

Co-Kriging is an extension of Kriging, which uses multiple attributes in a multi-variate system to produce an estimate of unknown points. Secondary abundant data sources (such as seismic data) that are highly correlated can be incorporated into the measure. The secondary data is then utilised to guide the interpolation of the primary sparse well data.

c) Stochastic Modelling:

The mathematically 'best' interpolation path is not always the most suitable as a realistic solution. Stochastic modelling creates multiple equally probably realisations of a model, each of which fits the sparse well data, but interpolates between them in different ways. Creating many such realisations allows for a greater choice and investigation of solutions, which would never be reached by so called 'safe' methods, such as Kriging, which always seek to minimise the error.

The average of many realisations should produce a result very similar to that of Kriging, smoothing out all the differences from each model. Error estimates and uncertainty analysis may also be derived from these multiple realisations. Each individual model, however, will be noisier than the "Kriged" result, but these can be smoothed after extracting the required statistics.

d) Base Library:

In exploration regions where no well data is available, assumptions of the rock properties may be made. A base library may be provided with common rock properties retrieved from different regions of the world. The common rock properties may be assigned to each model layer (e.g. facies) using multi attribute (including frequency magnitude volumes) volumes and facies classification. The validity of the rock property assignment may then be assessed by QC'ing (Quality Controlling) the geomodel back against the original seismic data.

e) Machine Learning:

Machine Learning is a process where computer algorithms "find" patterns in the data, enabling the computer to predict probable outcomes. In an aspect of the present invention Machine Learning is utilised to investigate complex/high dimensional parameter spaces and determine the most probable rock properties observed in the seismic data, and then to assign the predicted rock properties to each geological layer.

Machine Learning is therefore used to predict the rock properties observed in the seismic data by forward modelling each geological layer model with a range of common rock properties (within each layer), forming a training set of known labelled results.

Effectively, each variable density generated within the training set forms a "ground truth" in which information such as frequency decomposition magnitude volumes, facies classification volumes and attribute volumes (such as Quadrature, Envelope, Instantaneous Phase) are used as input features to train learning algorithms, such as, for example, a deep learning neural network.

Figure 11:
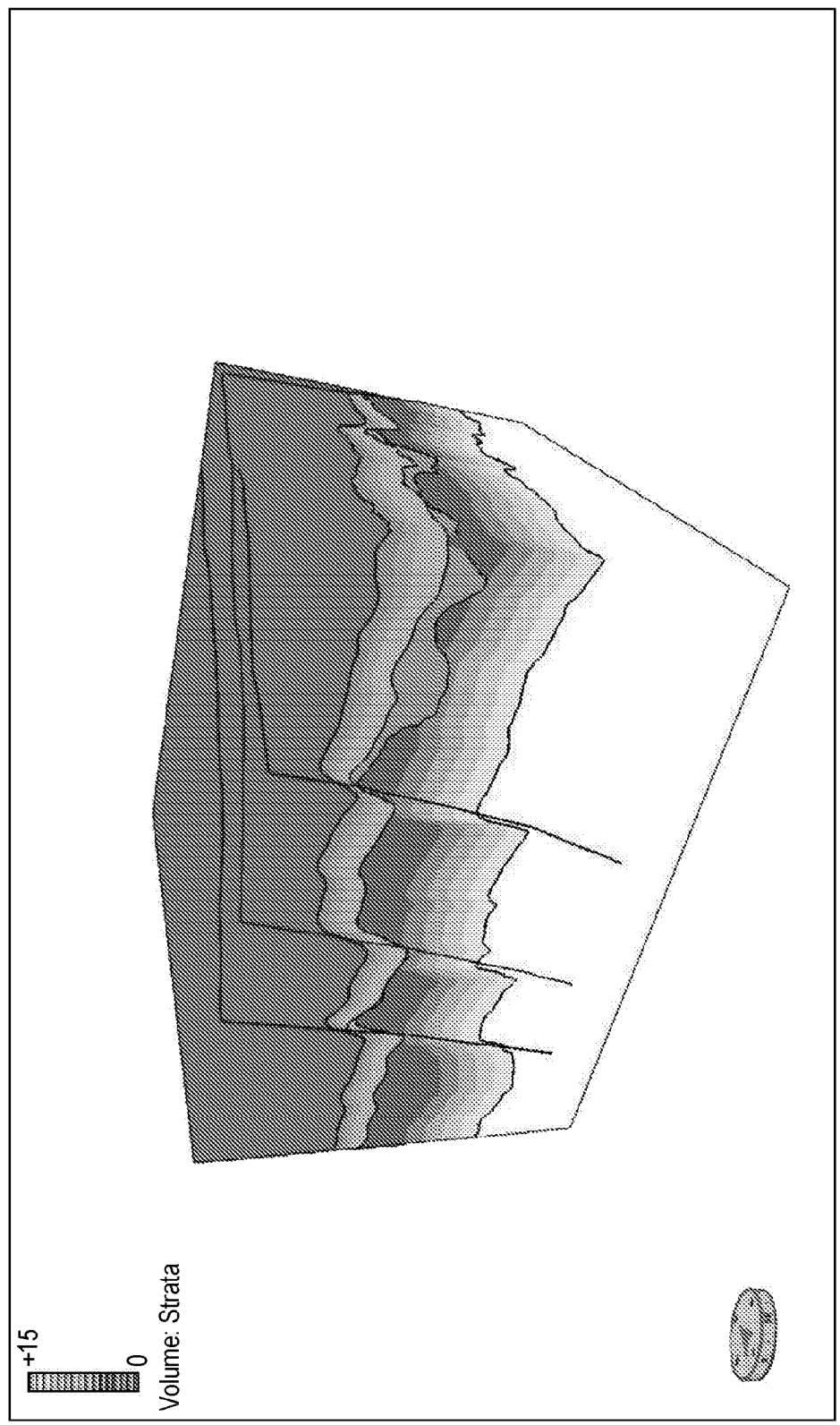
FIG. 11 shows an illustration of a geological model that is split into sections/regions.
Figure 12A:
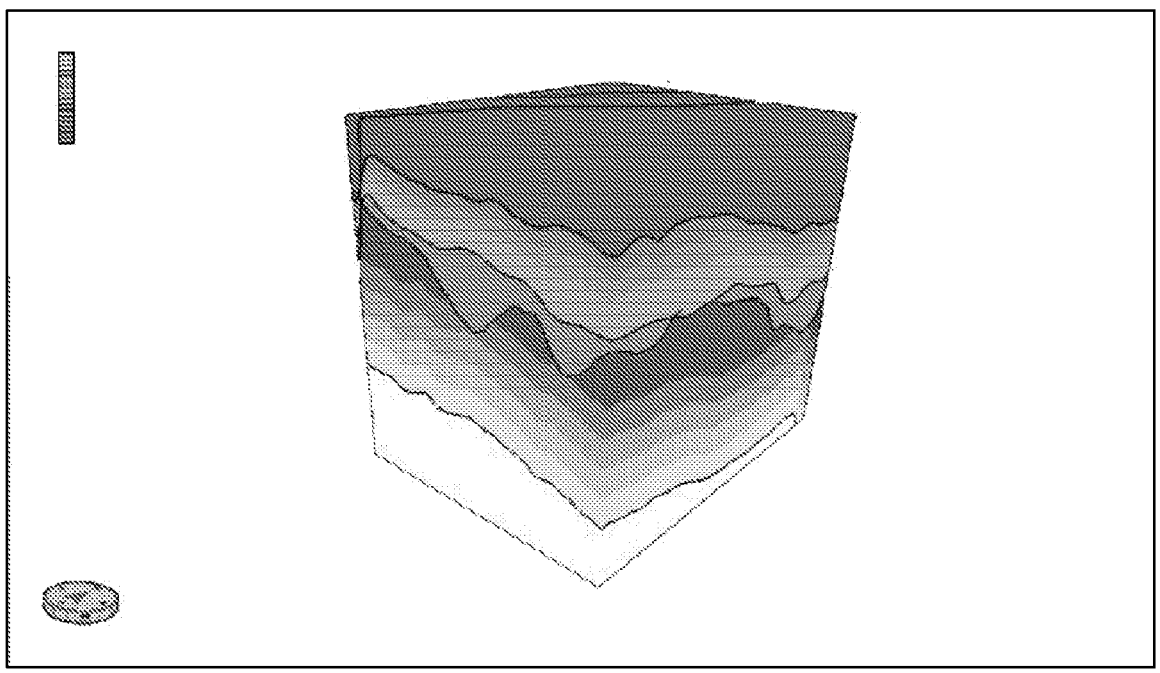
FIG. 12 shows (a) a close-up of the top-right region of the geological model in FIG. 11, and (b) its underlying seismic data.
Figure 12B:
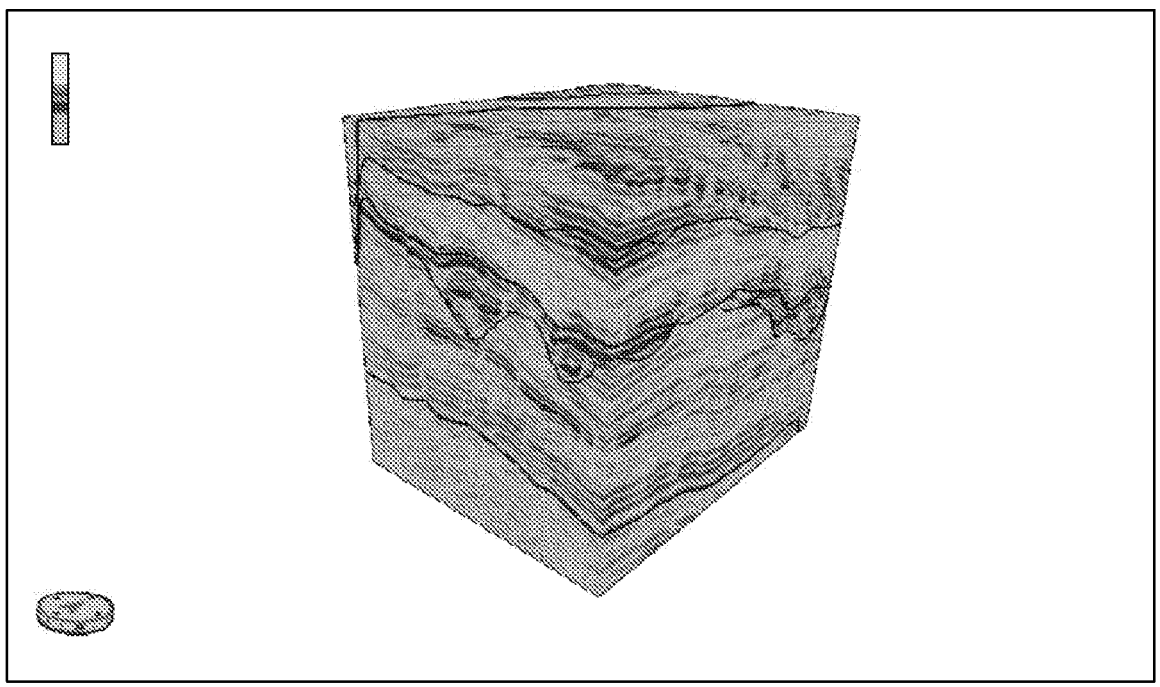

To reduce the complexity and variability of the classification problem, the geological model that is compared back to the seismic can be split into smaller regions. These regions could be divided into blocks (sub-volumes), and or slices as shown in FIGS. 11 and 12.

Additionally, the classification problem can be simplified even further by isolating the variability of the rock properties (Density, Vp, Vs) from other elements of the synthetic seismic data generation, such as, layer boundary and wavelet characteristics.

To this end, it is assumed that the model layers in the geological model define the rock lithology boundaries and not the seismic reflectivity, and that an appropriate wavelet is used, preferably an extracted wavelet from the seismic region of interest.

As the selected wavelet and thickness between layer boundaries significantly influences the generation of the seismic data, the degrees of freedom (DOF) of a synthetic model are reduced by fixing two out of the three forward modelling components, i.e. wavelet and thickness or model layer (for each region of interest).

Furthermore, for each layer within the geological model, a training set is built "on the fly", comprising, inter alia, an extracted seismic wavelet, the layer boundaries from the geological model, and varying rock properties (Density, Vp, Vs).

Different rock properties sequences are then used to create the training set for each zone. These sequences are defined using empirical knowledge of common rock sequencing (such as shale/sand/shale) from different parts of the world. Within each sequence, the full range of expected Density, Vp, Vs values for each rock within the sequence is used to generate a variable density for each combination. This process may be repeated to include fluid substitution.

Figure 13:
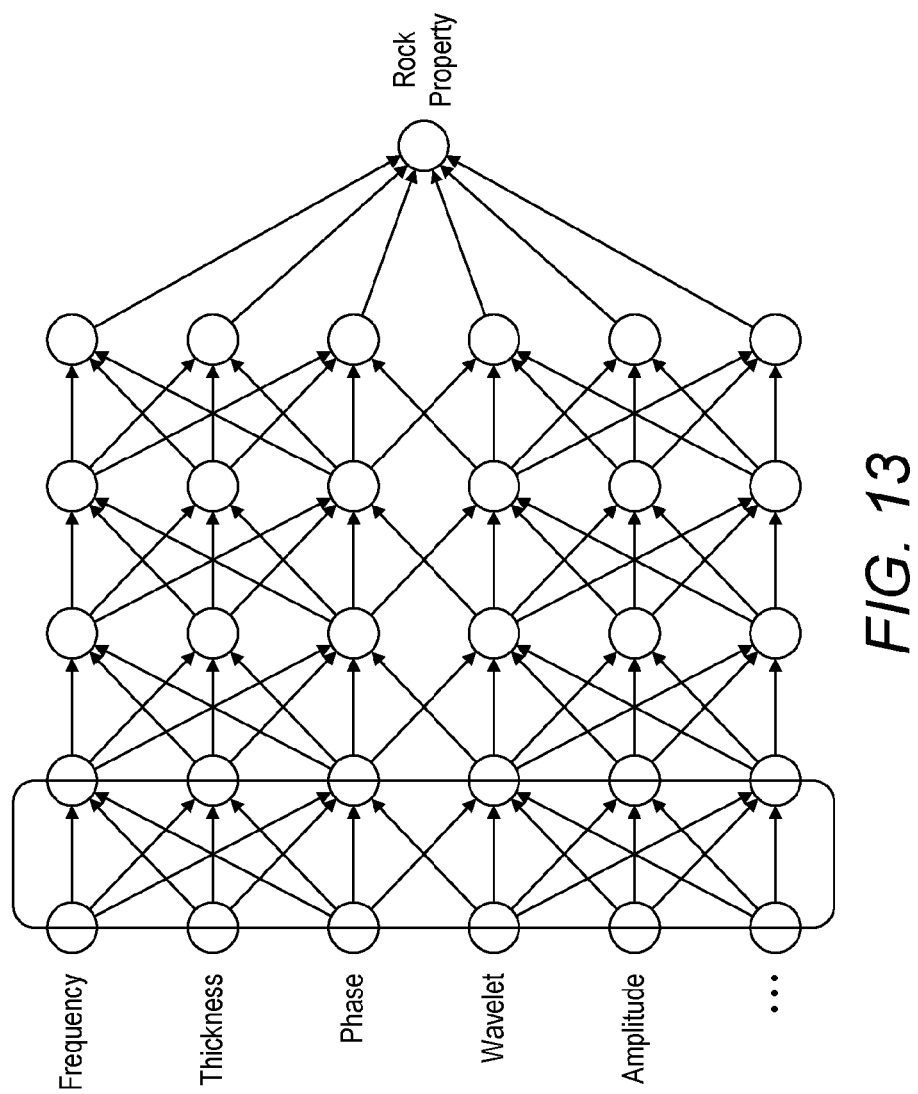
FIG. 13 shows an illustration of an example learning algorithm utilised to classify lithology.

As illustrated in FIG. 13, using then the labelled training set of common lithologies within a geological model, mimicking the lithology boundaries observed within the seismic, a learning algorithm, such as a deep learning neural network, is used to extrapolate new features from the limited set of features contained in the training set (such as frequency decomposition magnitude volumes, facies classification volumes and attribute volumes) to classify lithology types (sand, shale etc.).

Having now trained a learning algorithm to classify rock lithology within a particular zone, features extracted from the corresponding real data are fed into the learning algorithm to obtain a lithology prediction. The lithology prediction is then used to populate the appropriate layer within the geological model.

QC Step:

To now validate a rock property assigned geological model to the original seismic data, an assessment method is required. The assessment method compares the geological model, to which the lithologies have been assigned, by either Geostatistical, Base Library or Machine Learning propagation or any other method of assignment.

The synthetic model generated from the geological model can now be compared back to the original seismic data, using any one of a number of methods, such as, for example:

a) Visual Comparison

Figure 14:
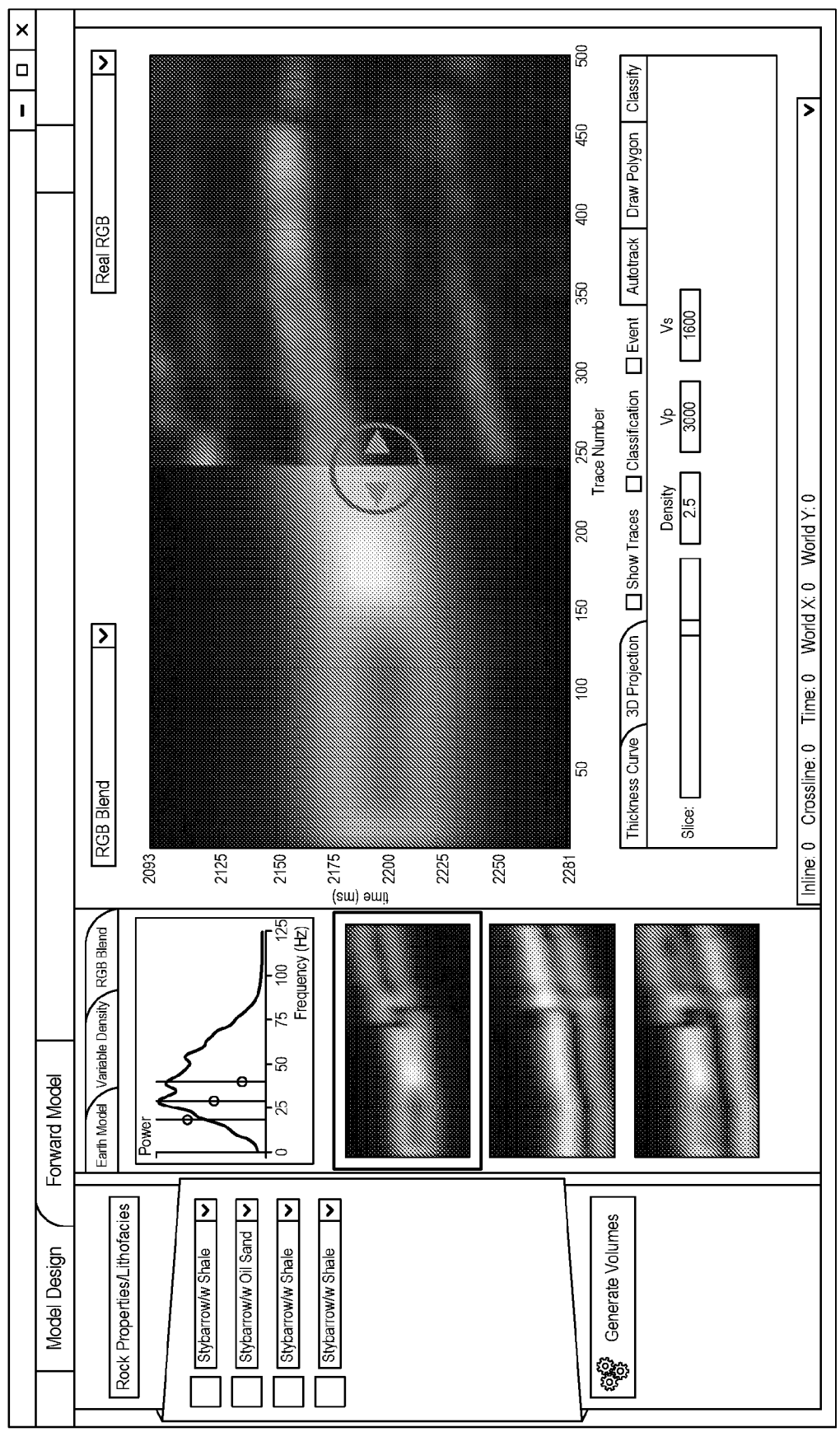
FIG. 14 shows an illustration of a sliding window for visual comparison of the synthetic seismic reflectivity data and corresponding image from the real data.

Referring now to FIG. 14, using an ineractive display such as a sliding window, a visual comparison of the synthetic seismic reflectivity data (or derived volumes such as frequency decomposition blends or other seismic attributes) and the corresponding imagary from the real data can be reviewed and compared.

b) Independent Trace-by-Trace Correlation

A full trace-length measure of similarity is calculated between the original seismic data and the synthetic model, with per-trace correlation, lateral granularity/localisation, but no vertical localisation.

c) Volume Difference

The original seismic data and synthetic data are compared as a whole, or within a series of sub-volumes. The comparison could be based directly on the seismic reflectivity data (i.e. synthetic model), or on any other seismic attribute, such as, envelope. This is a simple but noisy indicator, as the differences are per-voxel and very localised.

d) Spectral Comparison

A Fast Fourier transform is applied over both, the seismic and synthetic model, from full volumes/sub volumes/slices, and use different levels of granularity and averaging to compare the spectral content of the model and the seismic data. This would produce a global measure of spectral content differences, but without localisation within the model.

e) Layer Based

Figure 15A:
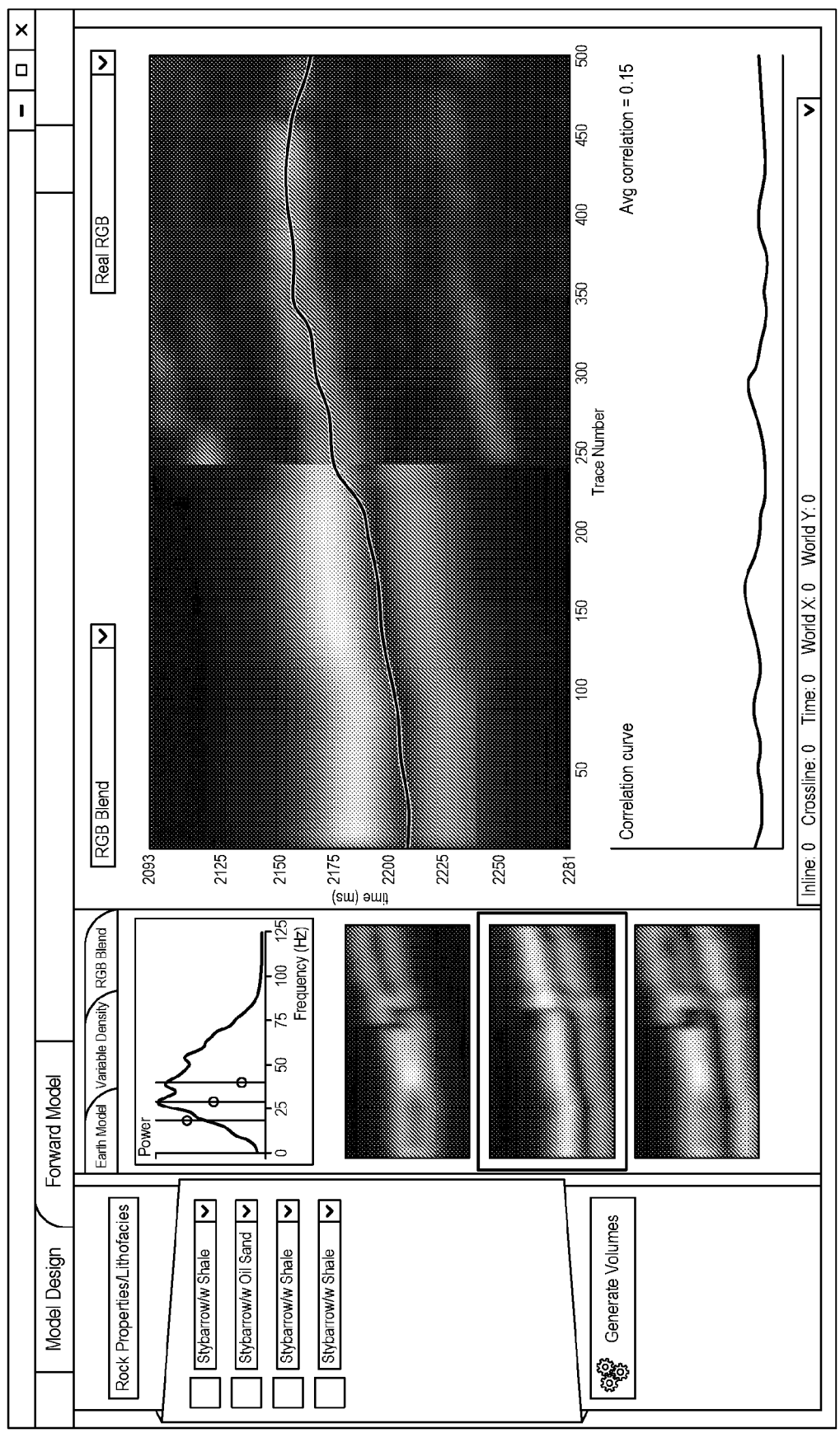
FIG. 15 shows examples (a) and (b) of single layer correlation between synthetic and RGB frequency blend.
Figure 15B:
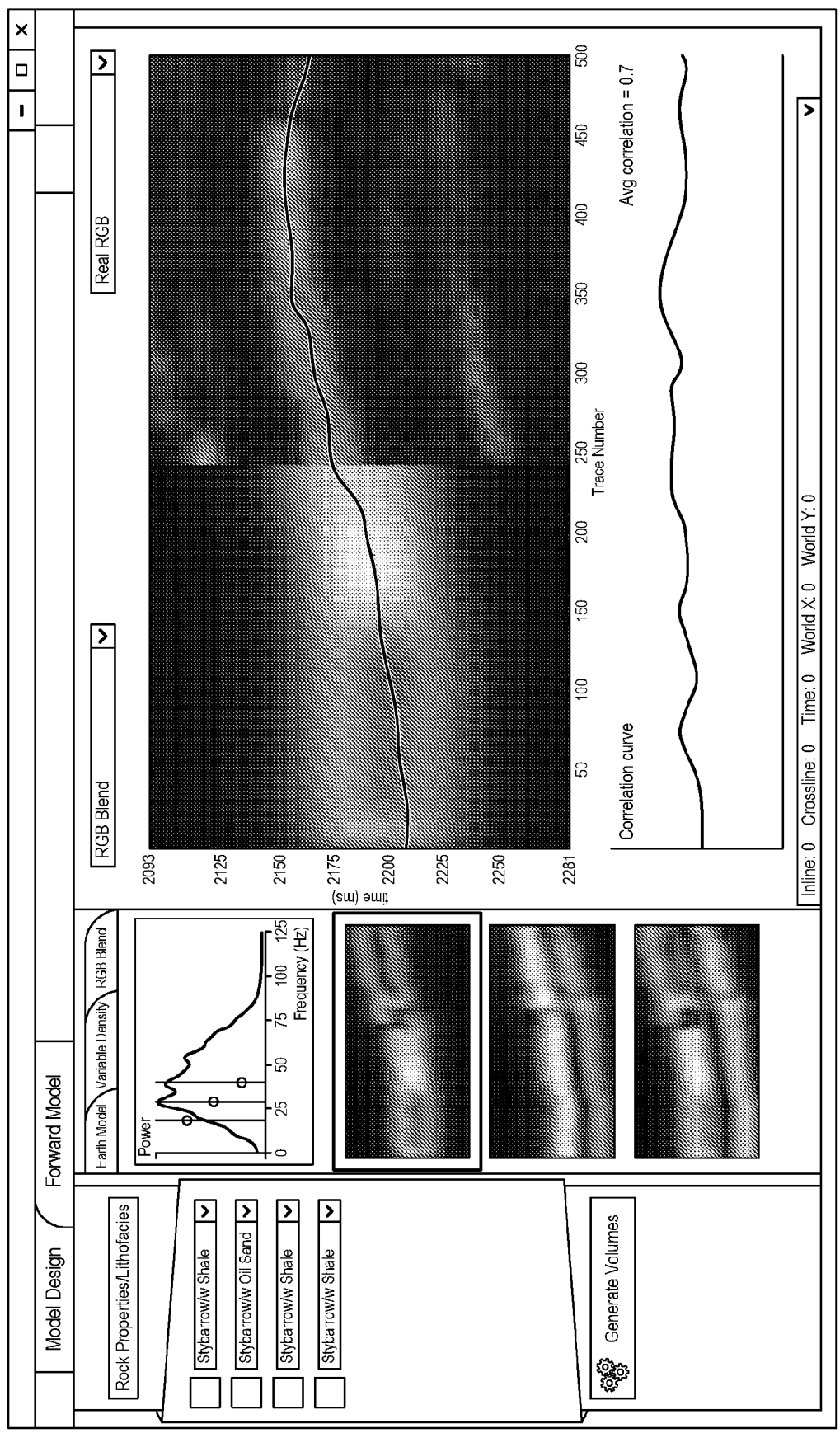
Figure 16:
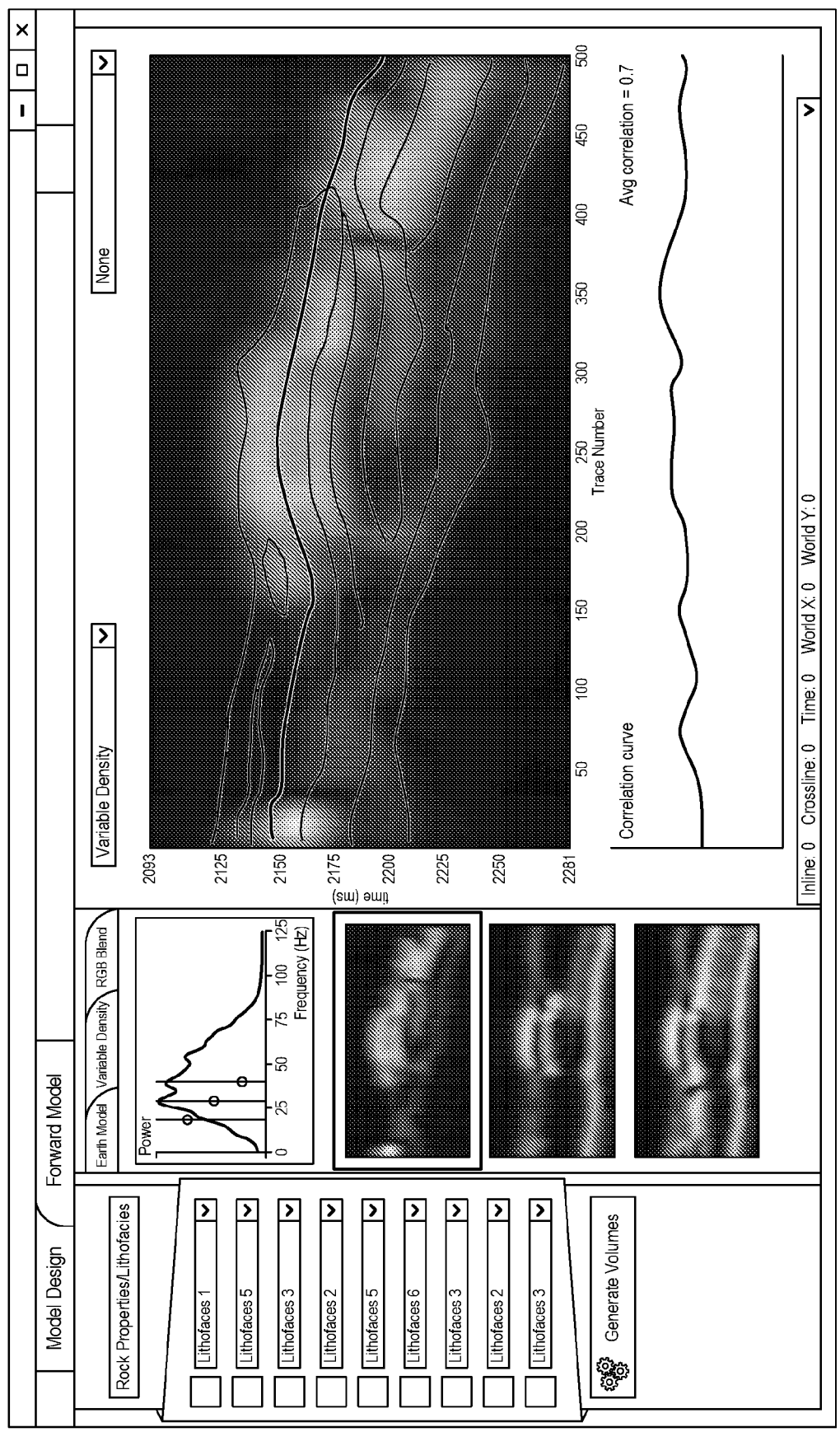
FIG. 16 shows an example of a multilayer correlation between synthetic and RGB frequency blend.

Referring now to FIGS. 15 and 16, an event or layer based measure of similarity could be formed by breaking down the full volume, sub volume or slice into its layers, and an overall correlation factor is computed from the correlation between the original seismic and synthetic seismic data for each point within each layer. The correlation may occur for a single layer as shown in FIG. 15 or multiple layers as shown in FIG. 16.

f) Wavelet Based

Matching pursuit decomposition techniques (e.g. GeoTeric™'s High Definition Frequency Decomposition), which characterise a signal by matching it to a set of wavelets can also be used to provide estimates of the correlation between the original seismic data and the synthetic data created from the model.

The wavelet matching uses, for example, a dictionary of wavelets that are matched to an input signal, by varying the wavelet scale, modulation, amplitude and phase. Correlations can then be made between the original seismic data and the synthetic seismic data by comparing these parameters. The correlation measurements may be done on a point by point basis, by comparing sections of a trace or by comparing sections of multiple traces. Most importantly, good correlation between some of the parameters but not others can be used as a diagnostic to determine which parameters of the model might be incorrect, e.g. if scale, modulation and amplitude of the matched wavelets show a good correlation, but the phase of the matched wavelets does not correlate well, then the problem is likely to be an error in the thickness value that has been assigned to the layer in the model.

Machine Learning:

Taking metrics from one or more of the aforementioned QC (Quality Control) approaches, Machine Learning techniques may be used to classify good matches between the original seismic data and the synthetic data created from the geological model. Classifying the fit, by comparing sections of a trace, or by comparing sections of multiple traces.

It will be appreciated by persons skilled in the art that the above embodiment has been described by way of example only and not in any limitative sense, and that various alterations and modifications are possible without departing from the scope of the invention as defined by the appended claims.

The invention claimed is:

1. A computer implemented method for generating a validated geological model from three-dimensional (3D) seismic data and rock property data that is based on one or more of well-logging data, a predefined library, or machine learning data, the method comprising the steps of:

(a) receiving rock property data from a first data source;

(b) receiving 3D seismic data from a second data source;

(c) based on the rock property data and the 3D seismic data, generating a geological model, wherein the geological model comprises a characteristic geological property;

(d) generating a synthetic model from the geological model, wherein the synthetic model is adapted to facilitate a comparison between selected data from the synthetic model and corresponding data from the 3D seismic data, and wherein the comparison further provides an indication detailing how the synthetic model changes relative to the geologic model when the characteristic geological property changes;

(e) comparing the selected data from the synthetic model against the corresponding data from the 3D seismic data, wherein, as a result of comparing the selected data from the synthetic model against the corresponding data from the 3D seismic data, the indication is provided, where the indication details how the synthetic model changes relative to the geologic model when the characteristic geological property changes;

(f) adjusting the characteristic geological property until the indication reflects a value that is within a predetermined threshold; and (g) generating a validated geological model that includes the characteristic geological property, which has been adjusted until the indication reflects the value that is within the predetermined threshold, wherein the synthetic model is a multi-layered model having the following property:

a first property in which a boundary that exists in the synthetic model and that is between two rock layers of a same type always yields a same reflection coefficient irrespective of where the boundary sits in the synthetic model.

2. The method of claim 1, wherein the geological model is based on a grid derived from the 3D seismic data.

3. The method of claim 1, wherein the rock property data includes the predefined library.

4. The method of claim 1, wherein the characteristic geological property is assigned from and modified in accordance with a probable data pattern determined utilizing machine-learning.

5. The method of claim 4, wherein the characteristic geological property is assigned utilizing any one of Kriging, Co-Kriging, stochastic modelling, a data from a predefined library, or machine-learning.

6. The method of claim 4, wherein the probable data pattern is determined using predetermined training data associated with the machine-learning.

7. The method of claim 1, wherein the characteristic geological property is a rock characteristic.

8. The method of claim 1, wherein the geological model comprises a plurality of geological objects.

9. The method of claim 8, wherein all of the plurality of geological objects are linked to each other.

10. The method of claim 8, wherein the plurality of geological objects includes one or more of a geobody, a horizon, or a fault.

11. The method of claim 1, wherein comparing the selected data from the synthetic model against the corresponding data from the 3D seismic data is performed via one or more of visual comparison, a trace-by-trace correlation, a difference between predetermined correlating volumes, or a spectral comparison.

12. The method of claim 5, wherein the probable data pattern is determined using predetermined training data associated with the machine-learning.

13. The method of claim 9, wherein the plurality of geological objects includes one or more of a geobody, a horizon, or a fault.

14. The method of claim 1, wherein the geological model is generated using a forward modeling technique that generates synthetic variable density volumes.

15. The method of claim 14, wherein implementation of the forward modeling technique results in a generation of an amplitude of a reflected P-wave.

16. The method of claim 14, wherein the synthetic model further has the following property:
as a result of the first property, a second property in which changes to an upper part in the synthetic model relative to the boundary has no impact on a synthetic seismic result to a lower part in the synthetic model relative to the boundary.

\* \* \* \* \*